United States Patent
Tan et al.

(10) Patent No.: US 7,272,760 B2
(45) Date of Patent: Sep. 18, 2007

(54) CURVE TRACING DEVICE AND METHOD

(75) Inventors: Seng Hin Tan, Singapore (SG); Kok Tong Tan, Singapore (SG)

(73) Assignee: Systems on Silicon Manufacturing Co. PTE. Ltd., Singapore (SG)

(*) Notice: Subject to any disclaimer, the term of this patent is extended or adjusted under 35 U.S.C. 154(b) by 268 days.

(21) Appl. No.: 10/992,223

(22) Filed: Nov. 18, 2004

(65) Prior Publication Data
US 2006/0123287 A1 Jun. 8, 2006

(51) Int. Cl.
*G01R 31/28* (2006.01)

(52) U.S. Cl. .................. 714/724; 324/765

(58) Field of Classification Search ............. 714/724, 714/736, 742; 324/754, 765
See application file for complete search history.

(56) References Cited

U.S. PATENT DOCUMENTS

| | | | |
|---|---|---|---|
| 5,101,150 A * | 3/1992 | Sullivan et al. ............. 714/724 |
| 6,791,344 B2 * | 9/2004 | Cook et al. ................. 324/754 |
| 6,815,972 B2 * | 11/2004 | Hsu ........................... 324/765 |
| 2005/0251715 A1 * | 11/2005 | Loh et al. ................... 714/736 |

* cited by examiner

*Primary Examiner*—James C Kerveros
(74) *Attorney, Agent, or Firm*—Christie, Parker & Hale, LLP

(57) ABSTRACT

A curve tracing method including simultaneously connecting a test IC sample and a reference IC sample to a switchboard; and selectively connecting a scanning voltage output or a sensing input of a curve tracer unit to each of the pins of the test IC sample and the reference IC sample via the pin switches and the IC sockets.

9 Claims, 6 Drawing Sheets

CURVE TRACING DEVICE AND METHOD

FIELD OF INVENTION

The present invention relates broadly to a device and method for curve tracing, and to a switchboard device for facilitating curve tracing.

BACKGROUND

Curve tracing is a pin-to-pin electrical verification technique to correlate or to verify the electrical failure mode of an Integrated Chip (IC) tested on an Advanced Test Equipment (ATE). A curve tracer or parametric analyzer equipment is typically used to view the IV characteristic (Current vs Voltage) on a failure pin as specified by the tester. Curve tracing of all the input, output, Vdd and Vss pins may be necessary at times during analysis.

One analysis technique or method for curve tracing is to fabricate a PCB board mounted with an IC socket and connecting each of the pins of the IC to a connector. Ribbon cables are used to electrically connect the connector to a switchboard. The switchboard consists of multiple switches, each connecting to individual pins on the mounted IC package. The switchboard is connected to the curve tracer. This is currently the most common setup in the Failure Analysis (FA) lab. A detailed description of this typical setup of using a switchboard is provided below.

As illustrated in FIG. 1, a typical switchboard 102 is connected to the curve tracer 104 on an ATE and a PCB socket 106 (an IC socket 108 mounted to a PCB 110). The PCB socket 106 is connected to the switchboard 102 using a ribbon cable 112. An IC sample to be curve traced is inserted on the IC socket 108 on the PCB 110. Each individual pin of the IC socket 108 is electrically connected to a neutral or middle terminal of a three-way switch, eg. 114. The scanning voltage output 116 of the ATE curve tracer 104 is connected to a terminal (+) of each of the three-way switches, eg. 114, while the sensing input 118 of the ATE curve tracer 104 is connected to a terminal (−) of each of the three-way switches, eg. 114.

The condition for curve tracing is then set by electrically connecting the neutral or middle terminal of the three-way switches, eg. 114, to either the scanning voltage output 116 or the sensing input 118 of the ATE curve tracer 104. An example of such a condition is to ground the sensing input 118 and to connect all the Vss pins of a particular IC chip to the sensing input and to connect all Vdd pins of the chip to a scanning voltage output 116 of the ATE curve tracer 104. Another example is to connect all Vss pins to ground and trace each pin by connecting the pin to a scanning voltage output 116 of the ATE curve tracer 104. Additional connectors, eg. 120, may be used to provide extra biasing for curve tracing in the event where the ATE curve tracer 104 is not able to provide a required level of voltage through the scanning voltage output 116 to any individual pin of the IC socket 108. The IV curve 122 is either remembered by the tester or stored for each pin (or a few pins at a time).

The limitations of using the current typical setup include that curve tracing can only be done on one IC sample at a time. Thus, comparison to a reference IC sample requires the removal of a test IC sample and the insertion of the reference IC sample on a single socket 108. At the same time, only one or a few pins may be traced on the same IC sample at any one time. There is also a need to remember the IV curve for each or several pins when making a comparison. This is not productive for comparison between pins numbering more than one hundred, for example. It is also not possible to curve trace all pins in a short time and therefore, only specific pins are curve traced. Normally, specific pins are traced according to a datalog with the assumption that the test coverage is 100%. Multiple insertion of IC samples and possible mishandling may also lead to increased chances of bending the IC leads as well leading to increasing the chances-of Electro-Static Discharge (ESD).

SUMMARY

In accordance with a first aspect of the present invention there is provided a curve tracing method comprising simultaneously connecting a test IC sample and a reference IC sample to a switchboard; and selectively connecting a scanning voltage output or a sensing input of a curve tracer unit to each of the pins of the test IC sample and the reference IC sample via the pin switches and the IC sockets.

In accordance with a second aspect of the present invention there is provided a switchboard device for facilitating curve tracing; the device comprising a plurality of pin switches disposed on the switchboard; at least two IC sockets for simultaneously connecting a test IC sample and a reference IC sample to the switchboard such that each pin of the test IC sample and the reference IC sample is electrically connected to a different one of the pin switches of the switchboard; and a comparison switch for selectively connecting a scanning voltage output or a sensing input of a curve tracer device to each of the pins of the test IC sample and the reference IC sample via the pin switches and the IC sockets.

In accordance with a third aspect of the present invention there is provided a curve trace device comprising a curve tracer unit having a scanning voltage output and a sensing input; a switchboard; a plurality of pin switches disposed on the switchboard; at least two IC sockets for simultaneously connecting a test IC sample and a reference IC sample to the switchboard such that each pin of the test IC sample and the reference IC sample is electrically connected to a different one of the pin switches of the switchboard; and a comparison switch for selectively connecting the scanning voltage output or the sensing input of the curve tracer unit to each of the pins of the test IC sample and the reference IC sample via the pin switches and the IC sockets.

The device may comprise a plurality of pairs of the IC sockets for different IC sample types and/or pin counts.

The device may further comprise one or more printed circuit board (PCB) sockets connected to the switchboard, each PCB socket for connecting one or more IC samples to the switchboard such that each pin of the respective IC samples is electrically connected to a different one of the pin switches of the switchboard.

The PCB socket may be connected to the switchboard via a ribbon cable.

The device may further comprise a plurality of bias connectors disposed on the switchboard, each bias connector facilitating biasing of one of the pins, of the IC samples.

The curve trace unit may comprise a single curve trace unit.

The curve trace unit may comprise a cathode ray tube (CRT).

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

The example embodiment described herein can provide an apparatus and a method for improving the ease of operation and cycle time for curve tracing.

Figure 1:
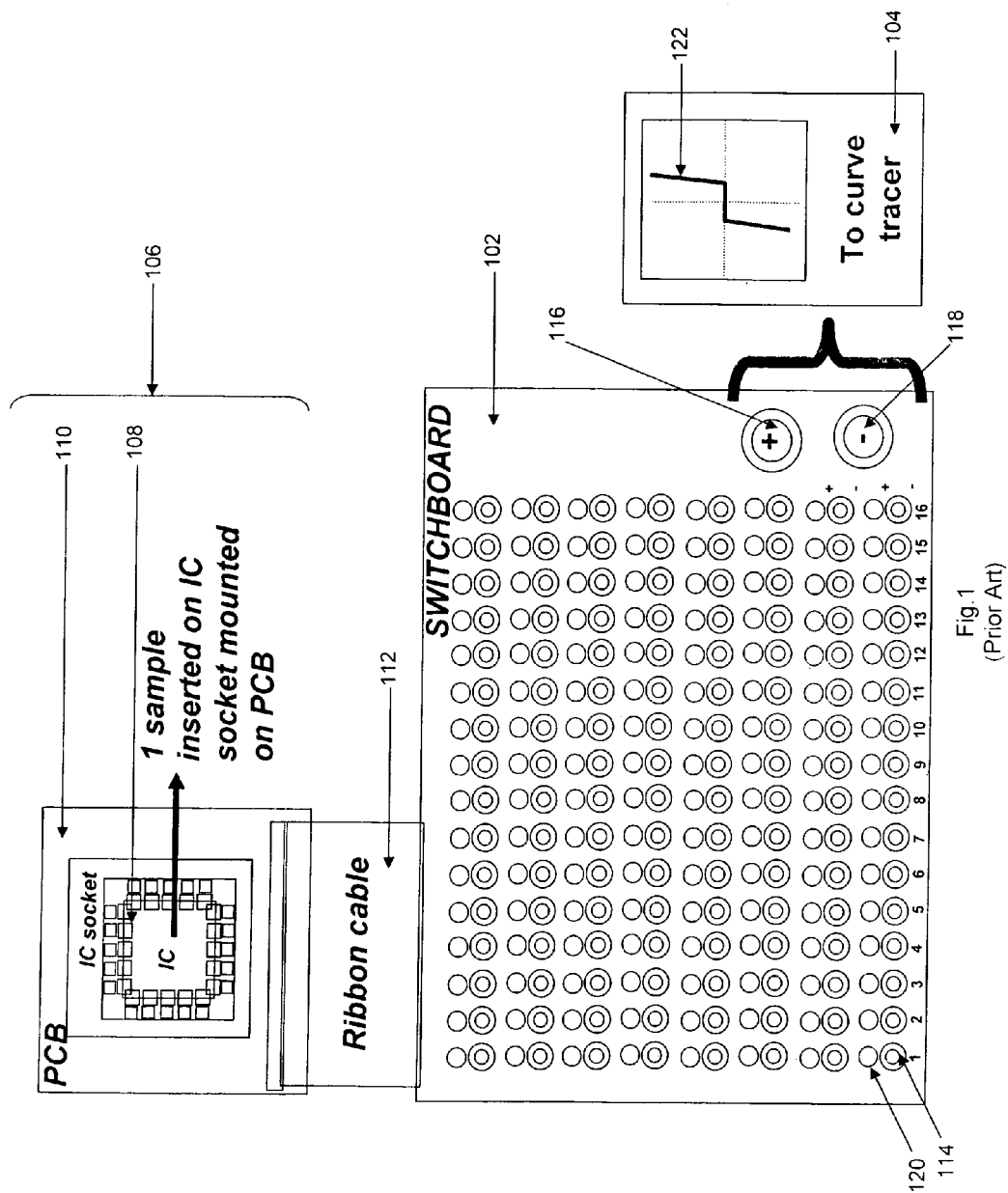
FIG. 1 is a schematic diagram for a typical switchboard for curve tracing.
Figure 2:
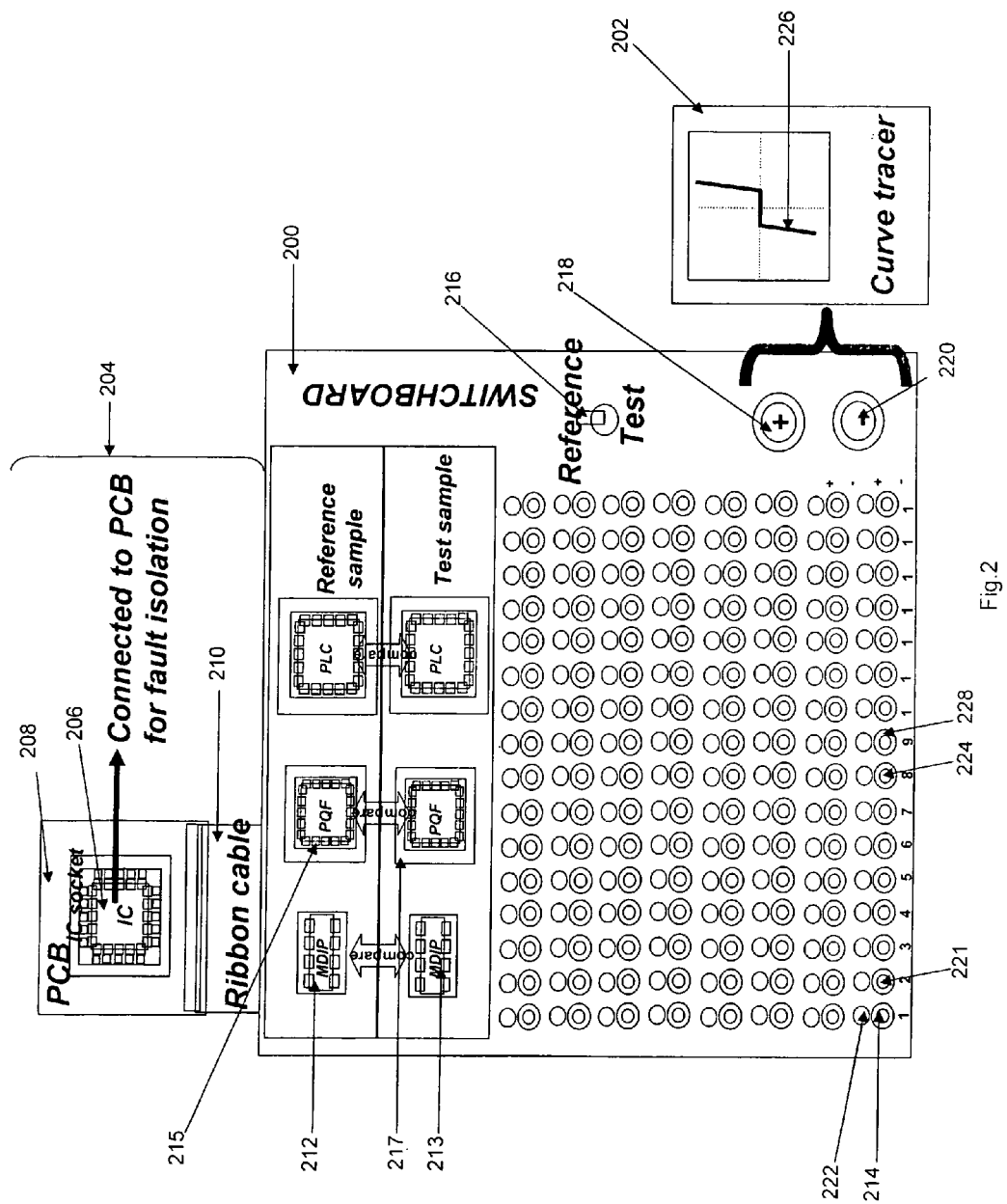
FIG. 2 is a schematic diagram for a curve tracing apparatus in an example embodiment.

FIG. 2 shows an apparatus for curve tracing in the example embodiment. In the example embodiment, a switchboard 200 is connected to a curve tracer 202 which is a single curve trace CRT (Cathode Ray Tube) display. A set of pairs of comparison sockets, eg. 212 and 213, is provided on the switchboard 200. Sockets for different pin-counts and packages eg. 215 and 217, are also provided on the switchboard 200. For example, a reference IC sample can be inserted into a socket 212 while a test IC sample for comparison to the reference sample may be inserted into a socket 213. Each individual pin of the IC sockets, eg. 212 and 213, is electrically connected internally to a neutral or middle terminal of a three-way switch, eg. 214 and 221.

A three-way comparison switch 216 that may be toggled to curve trace either the reference IC sample or the test IC sample is provided on the switchboard 200. The scanning voltage output 218 of the curve tracer 202 is connected to the neutral or middle terminal of the three-way comparison switch 216 while the sensing input 220 of the curve tracer 202 is connected to a terminal (−) of each of the three-way switches, eg. 214 and 221, for the individual pins.

Figure 3:
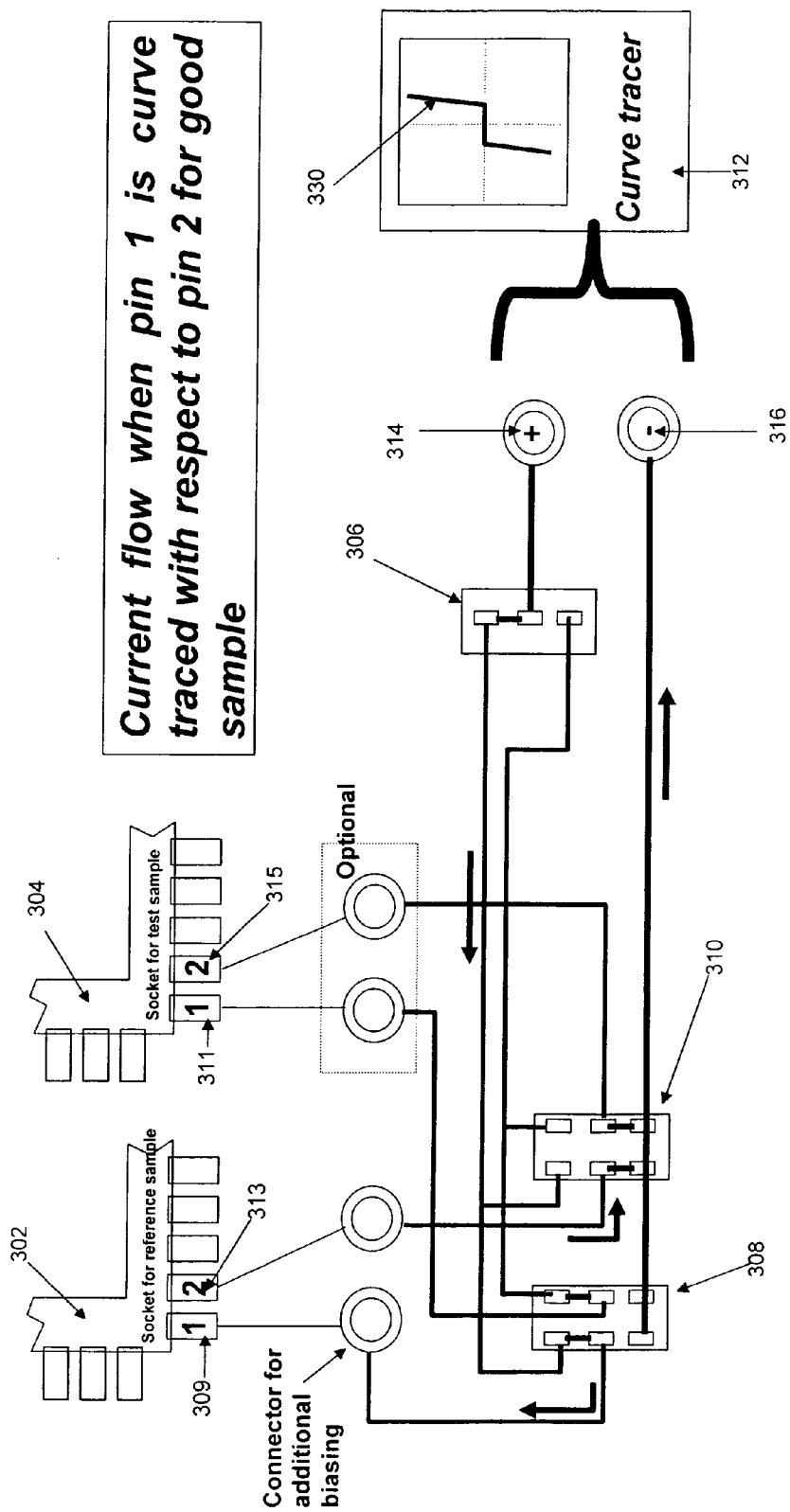
FIG. 3(a) is an illustration of curve tracing carried out on a reference IC sample by using a comparison switch in an example embodiment.
FIG. 3(b) is an illustration of curve tracing carried out on a test IC sample by using a comparison switch in an example embodiment.
FIG. 3(c) is a schematic diagram for internal electrical connections in a curve tracing setup in an example embodiment.
Figure 3:
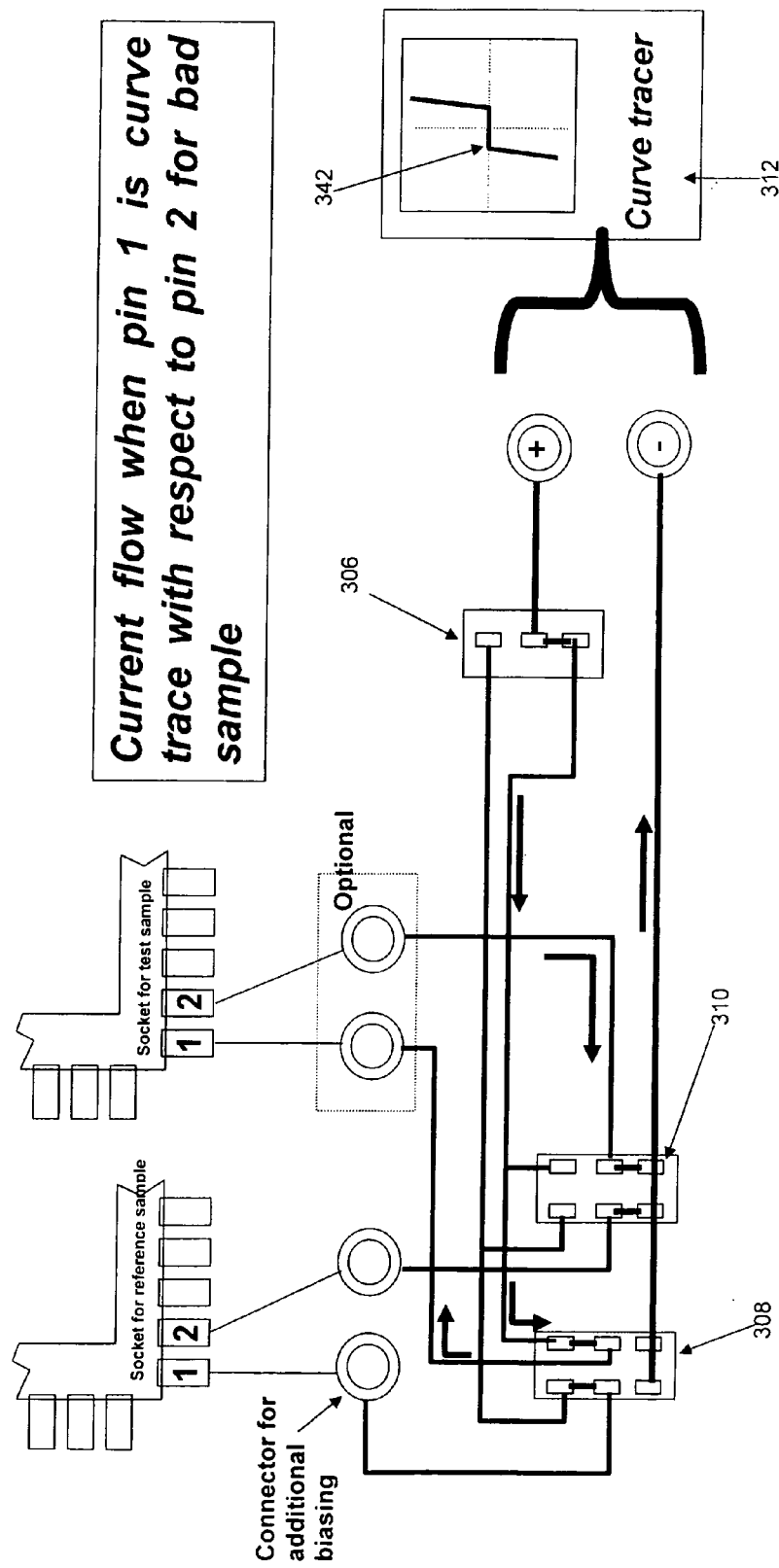
Figure 3:
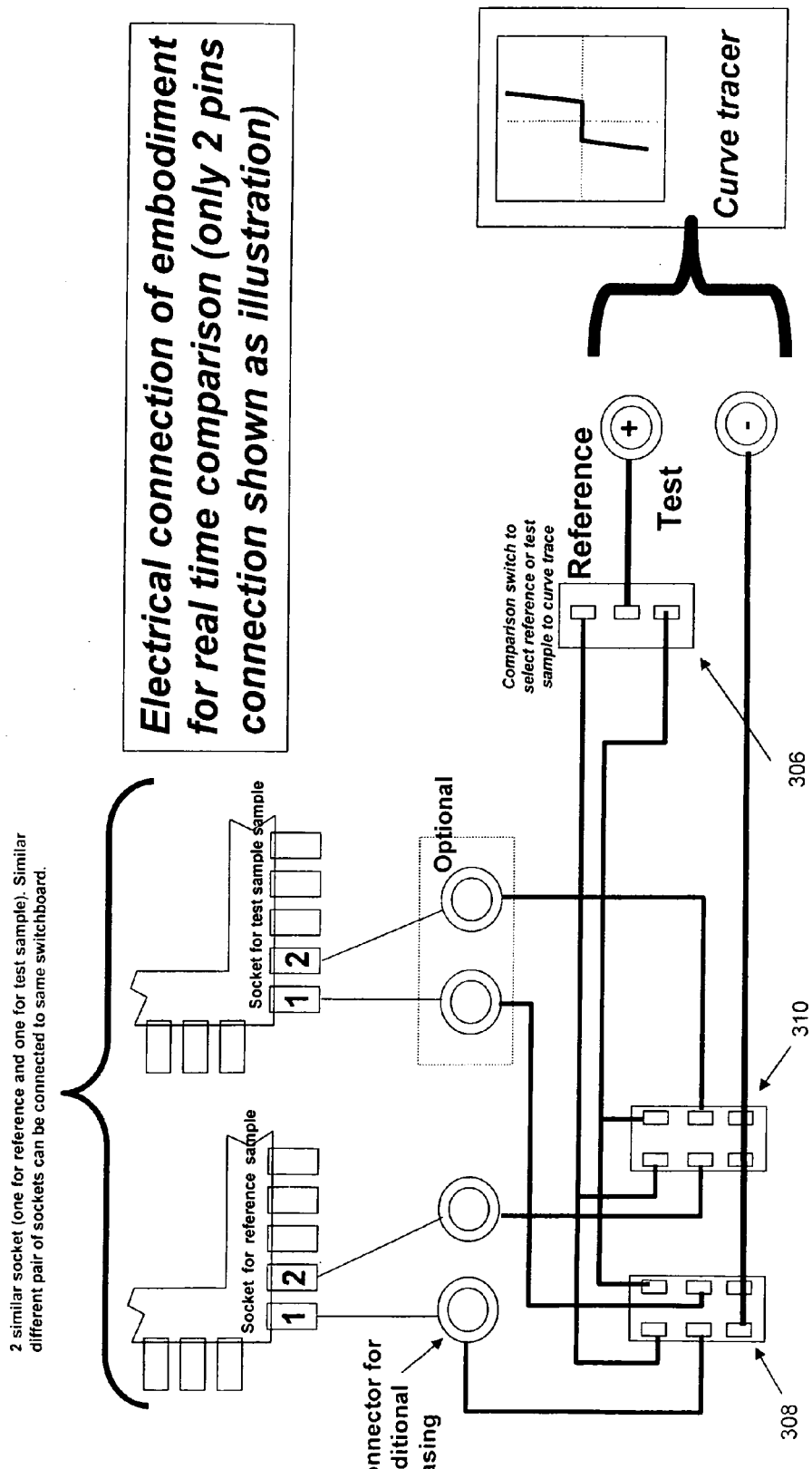

In this example embodiment, the comparison switch 216 is able to switch between connecting to the reference socket 212 and the test socket 213. Internally, the terminal (+) of the comparison switch 216 is connected to each of the three-way switches, eg. 214, for individual pins of the reference sockets, eg. 212, while its terminal (−) is connected to each of the three-way switches, eg. 221, for individual pins of the test sockets, eg. 213. Detailed illustrations of these connections are provided in following paragraphs with reference to FIG. 3.

The condition for curve tracing comparison is set by electrically connecting the individual pins of sockets, eg. 212 and 213, to either the scanning voltage output 218 via the comparison switch 216 or to the sensing input 220 of the curve tracer 202. The IV curve 226 is then displayed on the curve tracer 202.

FIG. 3(a) and (b) illustrate the working of the apparatus described in the example embodiment for curve tracing of a reference IC sample and a test IC sample. This example embodiment describes the curve tracing for a first pin, eg. 309 and 311, with respect to a second pin, eg. 313 and 315, of the reference and test IC samples respectively.

In FIG. 3(a), to obtain a curve trace for the first pin 309 of the reference IC sample, the comparison switch 306 connects the scanning voltage output 314 to the first pin 309 of the reference IC sample. The second pin 313 of the reference IC sample is connected to the sensing input 316 of the curve tracer 312 to complete the circuitry connection for curve tracing. The connections are achieved through appropriate electrical connections in the comparison switch 306 and the three-way switches 308 and 310 for individual pins. These connections are as shown in FIG. 3(a). To persons skilled in the art, it is clear that a scanning voltage is applied to the first pin 309 of the reference IC sample from the curve tracer 312 and a return signal is being acquired from the second pin 313 of the reference IC sample back to the sensing input 316 of the curve tracer 312. A curve trace 330 is then provided by the curve tracer 312 for the IV characteristics of the first pin 309 with respect to the second pin 313 for the reference IC sample in this example embodiment.

In FIG. 3(b), a curve trace for the test IC sample is carried out. The comparison switch 306 is now used to connect the scanning voltage output 314 to the first pin 311 of the test IC sample. The three-way switches, eg. 308 and 310, for individual pins do not need to be changed from their existing connections (compare FIG. 3(a)). Therefore, a scanning voltage is applied to the first pin 311 of the test IC sample from the curve tracer 312 and a return signal is being acquired from the second pin 315 of the test IC sample back to the sensing input 316 of the curve tracer 312. A curve trace 342 is then provided by the curve tracer 312 for the IV characteristics of the first pin 311 with respect to the second pin 315 for the test IC sample in this example embodiment.

FIG. 3(c) shows that the comparison switch 306 and the three-way switches, eg. 308 and 310, can be moved into their neutral positions where no connections are made. Electrical connections may be carried out for curve tracing of different pins and configurations. Other pins may be curve traced by using other switches such as three-way switch 224 and 228 (see FIG. 2).

In the example embodiment, both the reference IC sample and the test IC sample are inserted into their respective sockets, and a quick and immediate comparison of the curve traces of the reference IC sample and the test IC sample can be carried out simply by utilising comparison switch 306. This procedure may be repeated for other pins.

With reference to FIG. 2, the example embodiment further comprises a ribbon cable 210 connection between a PCB socket 204 (an IC socket 206 mounted to a PCB 208) and the switchboard 200. This can facilitate more flexibility in the use of the apparatus, e.g. for fault isolation, where a test IC sample may be inserted in the PCB socket 204. Additional connectors, eg. 222, may be used to provide extra biasing for curve tracing in the event where the curve tracer 202 is not able to provide a required level of voltage through the scanning voltage output 216 to any individual pin of the sockets, eg. 212, 213, 215, 217, 204.

In the example embodiment, an apparatus has been described where two samples may be curve traced in a straightforward manner almost instantaneously and the apparatus is both easy to use and user friendly since no software knowledge is required. The apparatus in this example embodiment utilises quick and immediate comparison between electrical data of two samples on a single curve trace CRT (Cathode Ray Tube) display. Typical automated curve tracers do not allow real-time comparison of results. An automated curve tracer traces one IC sample at a time and the IV curve for all pins are then stored in memory which may be costly to acquire. A second IC sample is then inserted into the automated curve tracer where again, the curve trace and IV curves for all pins are stored in memory. Comparison between the two IC samples for all the pins is then made using software control.

The example embodiment can provide a fast approach to pin-to-pin curve tracing comparison between reference and test IC samples by just the toggling of the comparison switch 306 and visual comparison of the curves. The visual comparison can be further facilitated by the image retention ability of the human eye. As the curve tracing in the example embodiment is quick and immediate, adjustments may be made to the biasing condition when an anomaly is found on a pin. An example is that the force voltage or current can be changed on the spot. In contrast, an automated curve tracer needs to trace all the pins on the 2 samples and only after the comparison is the failure pin known before the biasing condition can be changed. The analyst using the apparatus does not need to remember the IV curve 226 since comparison is quick and immediate. Many pins can be compared and at a much faster rate. This is a significant improvement on the time saving where previous methods for tracing 100 pins might take a minimum of about 30 minutes while in this example embodiment, curve tracing 100 pins might just take a maximum of about 3 minutes. The apparatus in the example embodiment can also be used for different packages and pin count using the same switchboard by just varying the IC sockets.

Figure 4:
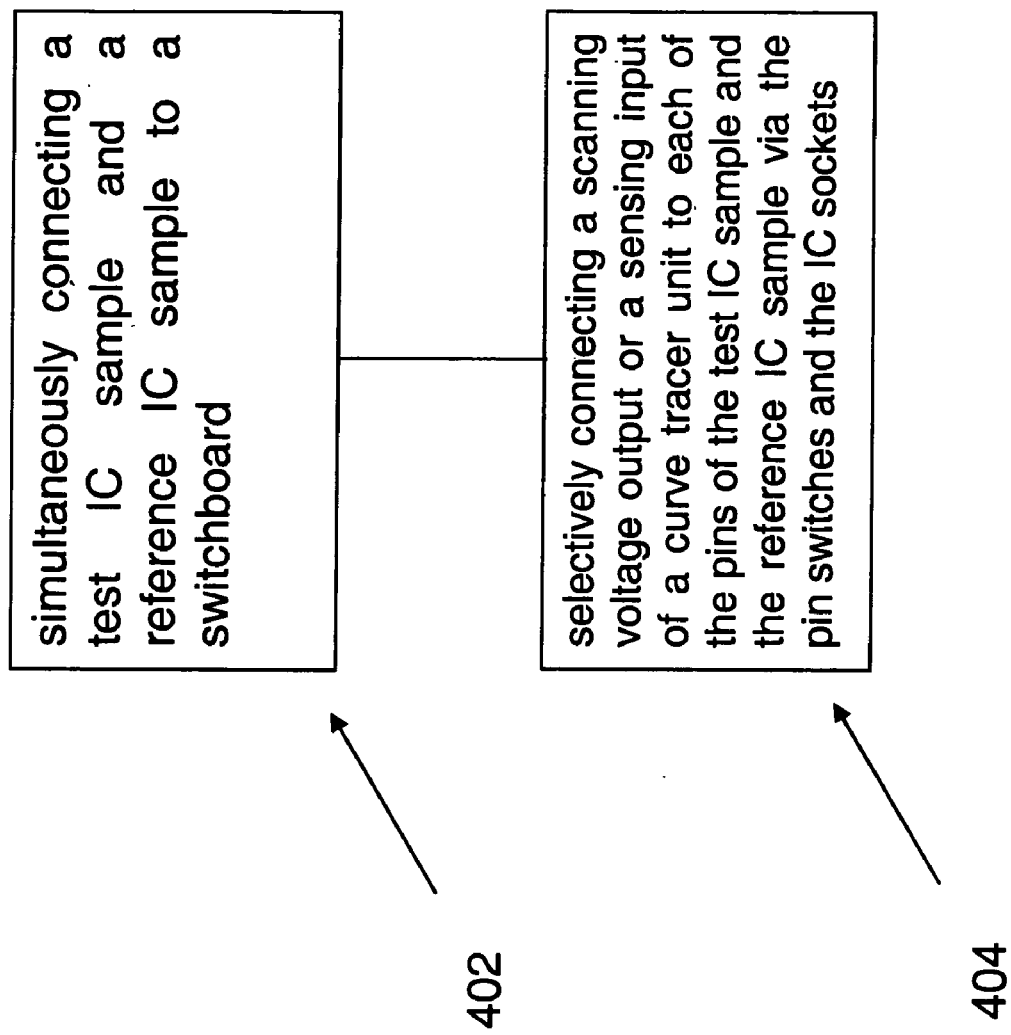
FIG. 4 shows a flow chart illustrating a curve tracing method in an example embodiment

FIG. 4 shows a flow chart illustrating a curve tracing method in an example embodiment. At step 402, a test IC sample and a reference IC sample are connected simultaneously to a switchboard; and, at step 404; a scanning voltage output or a sensing input of a curve tracer unit are selectively connected to each of the pins of the test IC sample and the reference IC sample via the pin switches and the IC sockets.

In addition, in the example embodiment, only one insert is needed for each reference and test IC sample. Having only a one-time insert not only reduces the chances of any bent IC leads, it also minimises the chances of ESD as well as reduces the time taken for curve tracing. Furthermore, the apparatus has a low cost and is easily maintained. A typical commercial system (multi-trace, automated curve tracer) is available but it typically uses low leakage electrical switches and a computer system for data analysis. A typical commercial system is both costly and the repair cost high. The described apparatus in the example embodiment is about 15 times cheaper than a low end automated curve tracer (which costs approximately SGD 30K). As the apparatus is purely hardware (mechanical switches, wires or PCB), the maintenance cost is relatively low as well. Conversely, an automated curve tracer uses electronic relay/switches, PC, software, control cards, etc which can be costly if repair is required. The apparatus in the example embodiment is portable and can be connected to any existing curve tracer or parametric analyzer whereas an automated curve tracer is a stand-alone equipment.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A curve tracing method comprising:
   simultaneously connecting a test IC sample and a reference IC sample to a switchboard, the test IC sample and the reference IC sample each having a plurality of contact pins; and
   selectively connecting a scanning voltage output and a corresponding sensing input of a curve tracer unit to respective ones of a first pair of the contact pins of the test IC sample in a first switching state of a comparison switch, and to respective ones of a second pair of the contact pins of the reference IC sample in a second switching state of the comparison switch.

2. A switchboard device for facilitating curve tracing; the device comprising:
   a plurality of pin switches disposed on a switchboard;
   at least two IC sockets for simultaneously connecting a test IC sample and a reference IC sample to the switchboard such that each pin of the test IC sample and the reference IC sample is electrically connected to a different one of the pin switches of the switchboard; and
   a comparison switch for selectively connecting a scanning voltage output and a corresponding sensing input of a curve tracer device to respective ones of a first pair of the contact pins of the test IC sample in a first switching state, and to respective ones of a second pair of the contact pins of the reference IC sample in a second switching state via the pin switches and the IC sockets.

3. A curve trace device comprising:
   a curve tracer unit having a scanning voltage output and a corresponding sensing input;
   a switchboard;
   a plurality of pin switches disposed on the switchboard;
   at least two IC sockets for simultaneously connecting a test IC sample and a reference IC sample to the switchboard such that each contact pin of the test IC sample and the reference IC sample is electrically connected to a different one of the pin switches of the switchboard; and
   a comparison switch for selectively connecting the scanning voltage output and the sensing input of the curve tracer unit to respective ones of a first pair of the contact pins of the test IC sample in a first switching state, and to respective ones of a second pair of the contact pins of the reference IC sample in a second switching state via the pin switches and the IC sockets.

4. The device as claimed in claim 3, comprising a plurality of pairs of the IC sockets for different IC sample types, pin counts or both.

5. The device as claimed in claims 3 or 4, further comprising one or more printed circuit board (PCB) sockets connected to the switchboard, each PCB socket for connecting one or more IC samples to the switchboard such that each contact pin of the respective IC samples is electrically connected to a different one of the pin switches of the switchboard.

6. The device as claimed in claim 5, wherein the PCB socket is connected to the switchboard via a ribbon cable.

7. The device as claimed in claim 3, further comprising a plurality of bias connectors disposed on the switchboard, each bias connector facilitating biasing of one of the contact pins of the IC samples.

8. The device as claimed in claim 3, wherein the curve trace unit comprises a single curve trace unit.

9. The device as claimed in claim 3, wherein the curve trace unit comprises a cathode ray tube (CRT).

* * * * *